United States Patent
Sugita

(10) Patent No.: US 10,629,717 B2
(45) Date of Patent: Apr. 21, 2020

(54) HIGH POWER DEVICE

(71) Applicants: Kabushiki Kaisha Toshiba, Minato-ku (JP); Toshiba Infrastructure Systems & Solutions Corporation, Kawasaki-shi (JP)

(72) Inventor: Kenichi Sugita, Kawasaki (JP)

(73) Assignees: Kabushiki Kaisha Toshiba, Minato-ku (JP); Toshiba Infrastructure Systems & Solutions Corporation, Kawasaki-shi (JP)

( * ) Notice: Subject to any disclaimer, the term of this patent is extended or adjusted under 35 U.S.C. 154(b) by 0 days.

(21) Appl. No.: 16/023,822

(22) Filed: Jun. 29, 2018

(65) Prior Publication Data

US 2019/0097033 A1 Mar. 28, 2019

(30) Foreign Application Priority Data

Sep. 28, 2017 (JP) ................................ 2017-188175

(51) Int. Cl.
*H01L 29/778* (2006.01)
*H01L 29/15* (2006.01)
(Continued)

(52) U.S. Cl.
CPC .......... *H01L 29/7783* (2013.01); *H01L 29/15* (2013.01); *H01L 29/155* (2013.01); *H01L 29/205* (2013.01); *H01L 29/2003* (2013.01)

(58) Field of Classification Search
CPC . H01L 29/7783; H01L 29/15; H01L 29/2003; H01L 29/205; H01L 2924/10346; H01L 31/030748; H01L 31/1848
See application file for complete search history.

(56) References Cited

U.S. PATENT DOCUMENTS 5,679,965 A * 10/1997 Schetzina .............. B82Y 20/00
257/103
6,727,531 B1 4/2004 Redwing et al.
(Continued)

FOREIGN PATENT DOCUMENTS

JP 11-204778 7/1999
JP 2000-228535 8/2000
(Continued)

OTHER PUBLICATIONS

People, R., et al. "Calculation of critical layer thickness versus lattice mismatch for $Ge_xSi_{1-x}$/Si strained-layer heterostructures", Appl. Phys. Lett. 47, No. 3, 1985, 4 pages.

*Primary Examiner* — Zandra V Smith
*Assistant Examiner* — Andre C Stevenson
(74) *Attorney, Agent, or Firm* — Oblon, McClelland, Maier & Neustadt, L.L.P.

(57) ABSTRACT

A high power device including with a first nitride semiconductor layer, a second nitride semiconductor layer formed on the first nitride semiconductor layer, and a third nitride semiconductor layer containing an Al element formed on the second nitride semiconductor layer. The second nitride semiconductor layer is a multiple quantum well layer in which a nitride semiconductor layer containing an In element and a nitride semiconductor layer not containing an In element are alternately stacked.

9 Claims, 4 Drawing Sheets

(51) Int. Cl.
*H01L 29/205* (2006.01)
*H01L 29/20* (2006.01)

(56) References Cited

U.S. PATENT DOCUMENTS

| | | | |
|---|---|---|---|
| 9,941,665 B1* | 4/2018 | Raring | B82Y 20/00 |
| 2005/0042789 A1* | 2/2005 | Fujikura | C30B 25/02 |
| | | | 438/47 |
| 2007/0018198 A1 | 1/2007 | Brandes et al. | |
| 2015/0028457 A1 | 1/2015 | Shikauchi et al. | |

FOREIGN PATENT DOCUMENTS

| | | |
|---|---|---|
| JP | 2003-197646 | 7/2003 |
| JP | 2004-515909 | 5/2004 |
| JP | 2005-45153 | 2/2005 |
| JP | 2009-507362 | 2/2009 |
| JP | 2013-4735 A | 1/2013 |
| JP | 2013-171898 | 9/2013 |
| JP | 2016-134612 A | 7/2016 |
| JP | 2017-17311 A | 1/2017 |
| JP | 2017-139390 A | 8/2017 |

\* cited by examiner

HIGH POWER DEVICE

CROSS-REFERENCE TO RELATED APPLICATION

This application is based upon and claims the benefit of priority from the prior Japanese Patent Application No. 2017-188175, filed on Sep. 28, 2017, the entire contents of which are incorporated herein by reference.

FIELD

Embodiments of the present invention relate to a high power device.

BACKGROUND

Conventionally, in a high power device (a High Electron Mobility Transistor (HEMT) device, as an example), there is a device with a structure in which an InGaN layer of a nitride semiconductor layer is thickly formed between a GaN layer of a nitride semiconductor layer and an AlGaN layer of a nitride semiconductor layer.

But when the InGaN layer is thickly formed, the connection between a lattice of the GaN layer and a lattice of the InGaN layer is cut off, and thereby the InGaN layer is relaxed. When the InGaN layer is relaxed, disturbance in the crystal structure, such as generation of a lattice defect, is generated, and thereby scattering of electrons acting as carriers is generated. For the reason, there was a problem that an electron mobility of a 2 dimensional electron gas (2 Dimensional Electron Gas, 2DEG) in an interface of the InGaN layer and the AlGaN layer is decreased, and an electron density of the 2 dimensional electron gas is decreased.

EMBODIMENT TO PRACTICE THE INVENTION

A high power device of an embodiment is provided with a first nitride semiconductor layer, a second nitride semiconductor layer formed on the first nitride semiconductor layer, and a third nitride semiconductor layer containing an Al element formed on the second nitride semiconductor layer. The second nitride semiconductor layer is a multiple quantum well layer in which a nitride semiconductor layer containing an In element and a nitride semiconductor layer not containing an In element are alternately stacked.

Hereinafter, embodiments of a high power device will be described based on the drawings.

EMBODIMENT

Figure 1:
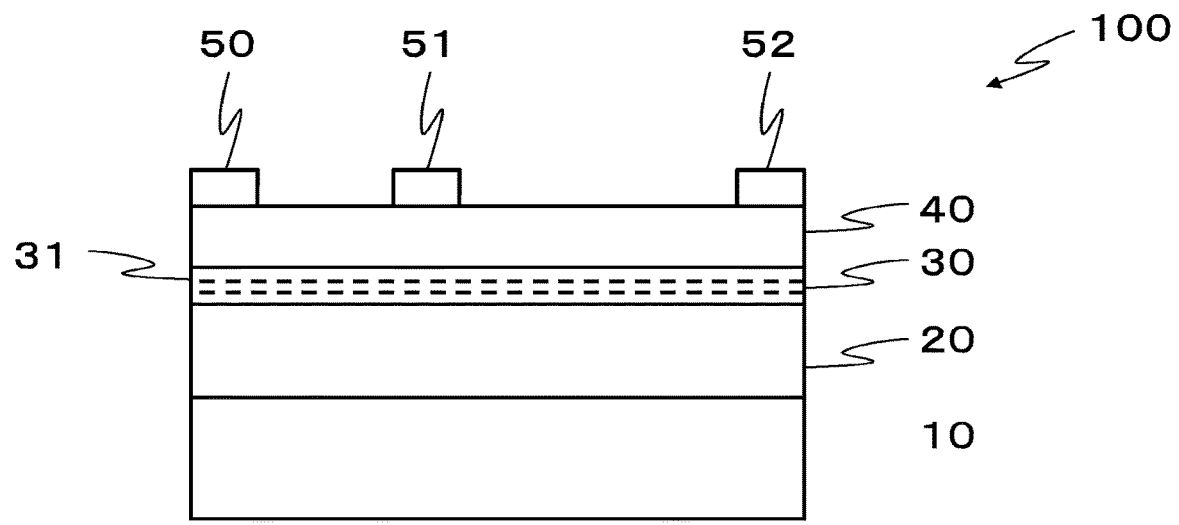
FIG. 1 is a sectional view of a high power device that is an embodiment.

FIG. 1 is a sectional view of a high power device 100 of the present embodiment. Nitride semiconductor layers 20, 30, 40 are stacked on a substrate 10, and in addition, electrodes 50, 51, 52 are provided on the nitride semiconductor layer 40.

The high power device 100 is a high power field effect transistor device, for example, and is a high power High Electron Mobility Transistor (HEMT) device, for example. In addition, the high power device 100 is a high frequency power amplifier which power-amplifies a high frequency signal of a microwave band or a millimeter wave band.

The gallium nitride layer (a GaN layer, a first nitride semiconductor layer) 20 is formed on the substrate 10. The multiple quantum well layer (a stacked layer of InxGa1-xN layers (1≥x>0) and GaN layers, a second nitride semiconductor layer) 30 is formed on the gallium nitride layer 20 as a channel layer. Further, the aluminum gallium nitride layer (an AlGaN layer, a third nitride semiconductor layer) 40 is formed on the multiple quantum well layer 30. 2 dimensional electron gases 31 (dashed lines of FIG. 1) are formed in the multiple quantum well layer 30. The multiple quantum well layer (the second nitride semiconductor layer) 30 is composed of nitride semiconductor layers containing an In element and nitride semiconductor layers not containing an In element which have been alternately stacked.

As a member of the substrate 10, there are silicon (Si), silicon carbide (SiC), sapphire ($\alpha$—$Al_2O_3$), zinc oxide (ZnO), gallium nitride (GaN), aluminum nitride (AlN), diamond, and so on. However, in the present embodiment, the member of the substrate 10 is not limited to these.

The source electrode 50, the gate electrode 51 and the drain electrode 52 are provided on the aluminum gallium nitride layer 40. The source electrode 50, the gate electrode 51 and the drain electrode 52 are provided separately to each other. The source electrode 50 and the drain electrode 52 are provided so as to sandwich the gate electrode 51.

A protective layer may be provided on the aluminum gallium nitride layer 40, the source electrode 50, the gate electrode 51 and the drain electrode 52. There is a silicon nitride (SiN) layer, as an example of the protective layer.

The gallium nitride layer 20, the multiple quantum well layer 30 and the aluminum gallium nitride layer 40 are each a nitride semiconductor layer. In the present embodiment, these layers are each composed of a III-V semiconductor in which a group III element such as aluminum (Al), gallium (Ga) and indium (In), and a group V element of nitrogen (N) are combined.

Figure 2:
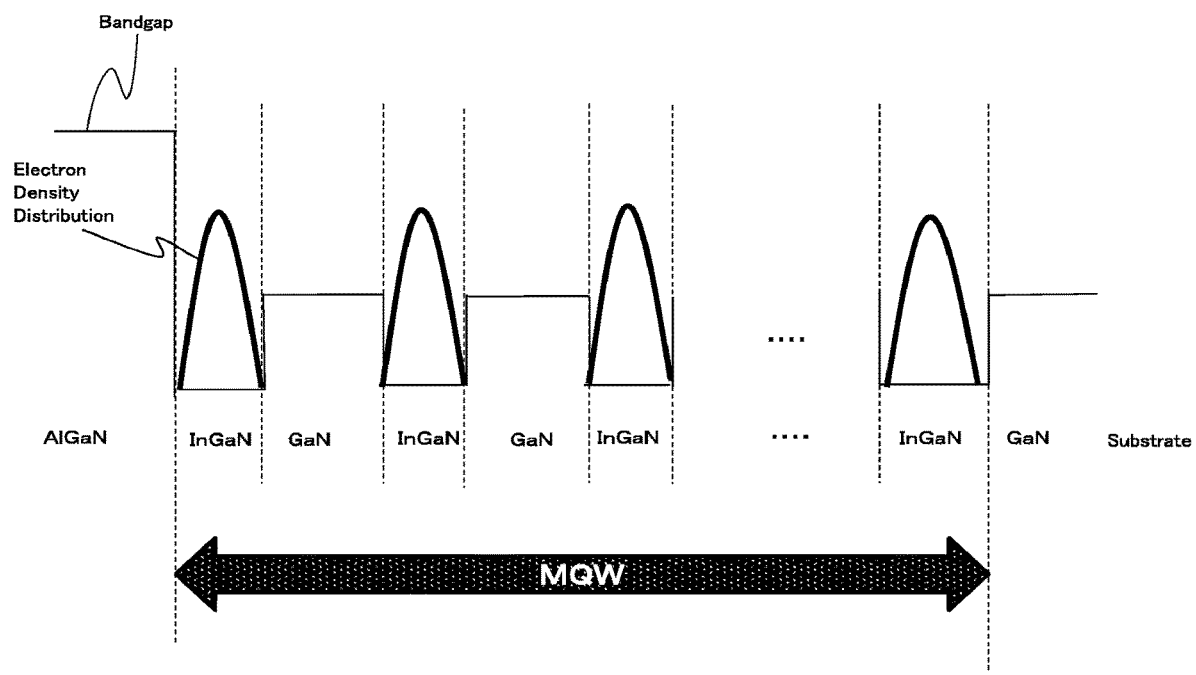
FIG. 2 is a diagram schematically showing a band structure of a conduction band of the embodiment.

FIG. 2 is a diagram showing a band structure of a conduction band of the embodiment. The indium gallium nitride layer and the gallium nitride layer composing the multiple quantum well layer 30, and the aluminum gallium nitride layer 40 formed on the multiple quantum well layer 30 have different bandgaps respectively.

When the aluminum gallium nitride layer 40 and the indium gallium nitride layer which composes the multiple quantum well layer 30 and is adjacent to the aluminum gallium nitride layer 40 are joined, a quantum well of energy level is formed in the vicinity of the junction surface (the hetero interface), and electrons are accumulated in the quantum well in a high density to form the 2 dimensional electron gas 31.

In addition, the bandgap of the indium gallium nitride layer composing the multiple quantum well layer 30 is lower than the bandgap of the gallium nitride layer similarly composing the multiple quantum well layer 30, and since the indium gallium nitride layer is sandwiched between the gallium nitride layers, a quantum well is formed here as well. Electrons are also accumulated in this quantum well in a high density to form the 2 dimensional quantum gas 31. In the high power device 100 of the embodiment, the quantum wells like this are repeated to form the multiple quantum well layer, and thereby electrons can be accumulated in a higher density.

Figure 3:
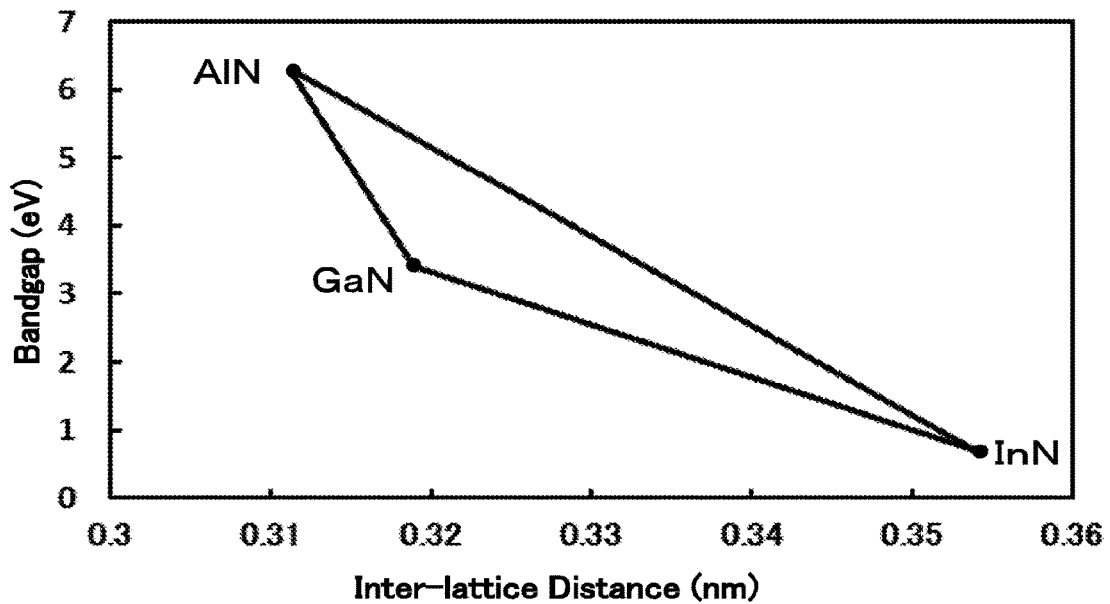
FIG. 3 is a correlation diagram showing a correlation of an inter-lattice distance and a bandgap of the embodiment.

FIG. 3 is a correlation diagram showing a correlation of an inter-lattice distance and a bandgap of the nitride semi-conductors, and is a diagram in which a value of the inter-lattice distance and a value of the bandgap of each of GaN, AlN, InN is plotted, and the respective plot points are connected by lines.

A line connecting GaN and AlN becomes a characteristic of AlyGa1-yN. y is a composition ratio of an aluminum element (Al), and 1≥y≥0. That is, when the composition ratio of the aluminum element (Al) is made larger, and the composition ratio of the gallium element (Ga) is made smaller, the aluminum gallium nitride approaches AlN, and the bandgap becomes larger.

A line connecting GaN and InN becomes a characteristic of InxGa1-xN. x is a composition ratio of an indium element (In), and 0≤x≤1. That is, when the composition ratio of the indium element (In) is made larger, and the composition ratio of the gallium element (Ga) is made smaller, the aluminum gallium nitride approaches InN, and the bandgap becomes smaller. In addition, as the indium composition is larger, so an effective mass of an electron is smaller, and accordingly the electron mobility increases to improve the high speed, high frequency characteristics of the high power device 100.

The multiple quantum well layer 30 in the high power device 100 of the present embodiment is formed of InGaN and GaN. The performance of the high power device 100 becomes best when the bandgap difference of InGaN and GaN becomes maximum, that is, when x=1 in InxGa1-xN.

In addition, in the high power device 100 of the present embodiment, it is desirable that a film thickness of the indium gallium nitride layer of the multiple quantum well layer is up to 10 nm assuming that the indium gallium nitride layer is not relaxed, and a film thickness of the gallium nitride layer of the multiple quantum well layer is up to 20 nm. The number of pairs of the indium gallium nitride layer and the gallium nitride layer is set to 1-100, and x is set to 1 as described above in the composition ratio of the indium gallium nitride layer (InxGa1-xN), and thereby the best performance can be obtained. It is desirable that a film thickness of the indium gallium nitride layer (that is the indium nitride layer) with this composition ratio is set to 0.26 nm.

Figures 4A, 4B, 4C:
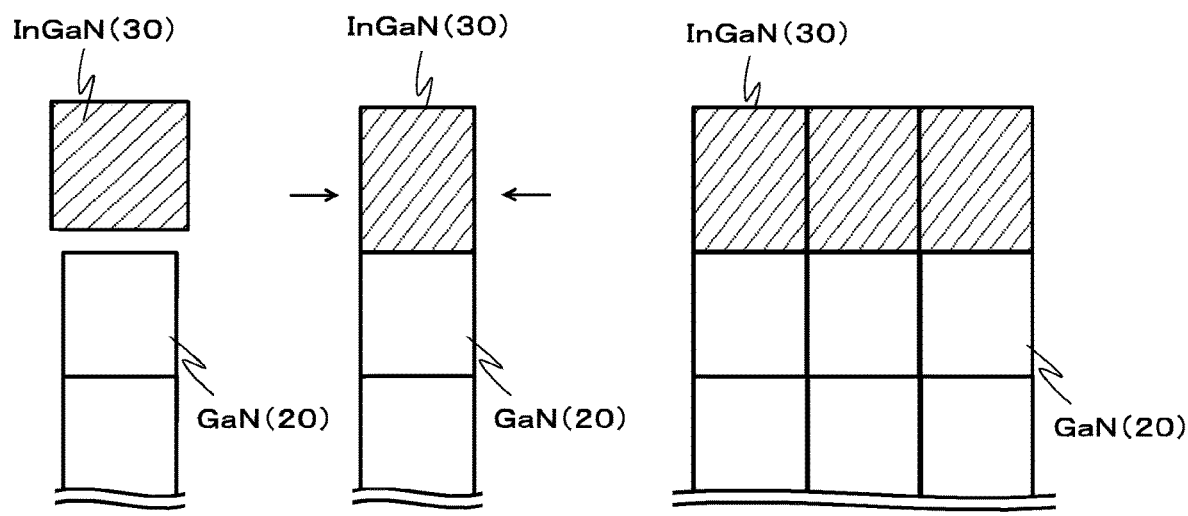
FIGS. 4A, 4B and 4C are each a diagram showing lattice connection of the nitride semiconductor layers of the embodiment.

FIGS. 4A, 4B and 4C are each a diagram showing lattice connection of the nitride semiconductor layers of the embodiment. FIG. 4A is a schematic diagram of an inter-lattice distance of each of the gallium nitride layer and the indium gallium nitride layer. One lattice is expressed by a quadrangle. When FIG. 3 is referred to, since the inter-lattice distance of the indium gallium nitride layer is larger than the inter-lattice distance of the gallium nitride layer 20, the relation shown in FIG. 4A is obtained between the respective layers.

FIG. 4B is a diagram showing the lattice connection when the indium gallium nitride layer is stacked on the gallium nitride layer.

Figure 7:
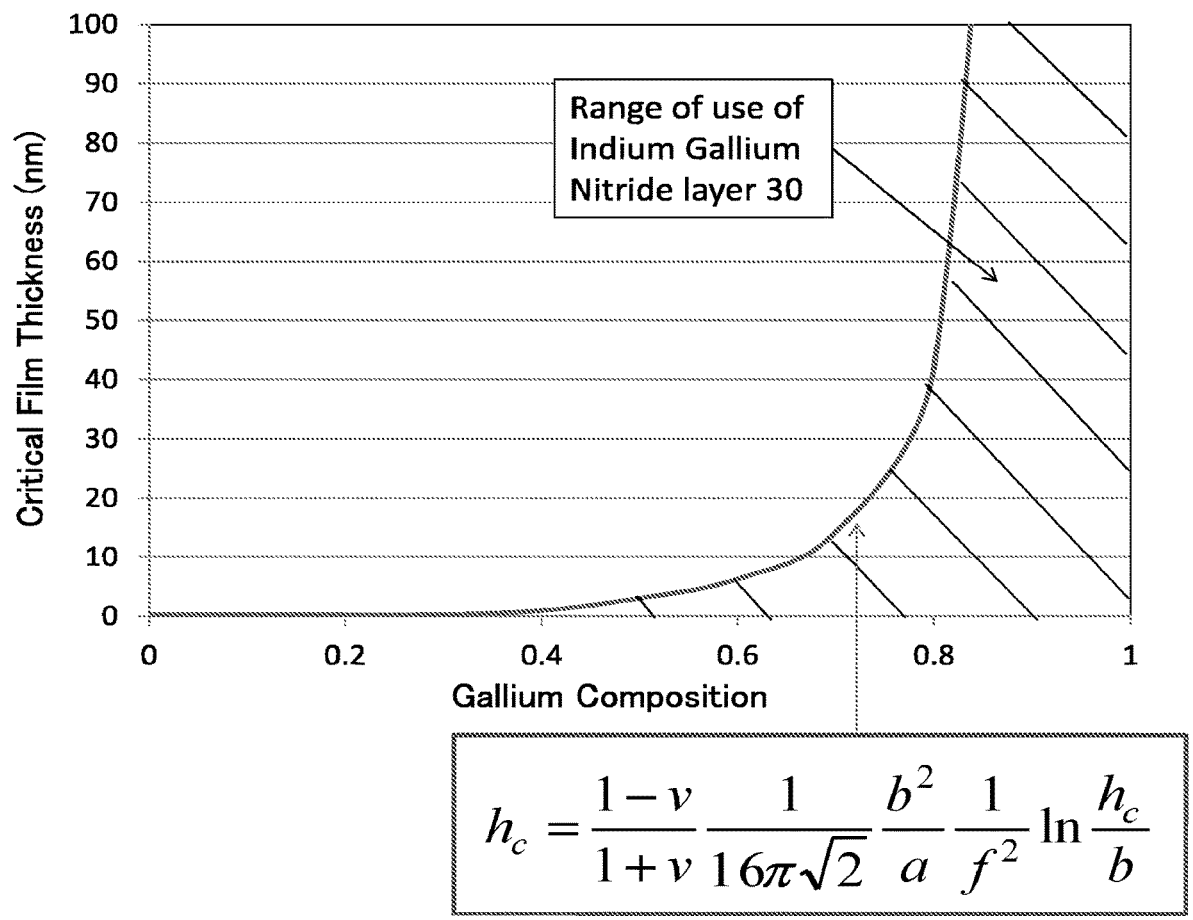
FIG. 7 is a diagram showing the relation of a gallium composition and a critical film thickness.

A film thickness (a critical film thickness) of the indium gallium layer 30 when it is not relaxed depends on the inter-lattice distances of the gallium nitride layer 20 and the indium gallium nitride layer 30. The inter-lattice distance of the indium gallium nitride layer 30 is determined by the composition of indium and gallium. FIG. 7 shows the relation of a gallium composition and a critical film thickness. According to R. People and J. C. Bean, Appl. Phys. Lett 47, 322 (1985), a relation expression (1) of a gallium composition and a critical film thickness of FIG. 7 is expressed as follows $$h_c = \frac{1-v}{1+v}\frac{1}{16\pi\sqrt{2}}\frac{b^2}{a}\frac{1}{f^2}\ln\frac{h_c}{b} \quad (1)$$

(hc is a critical film thickness, b is a Burgers vector of dislocation, a is a lattice constant of gallium, v is a Poisson's ratio, f is a lattice mismatch degree |Δa/a|).

A range shown by hatched lines becomes a region where the indium gallium nitride layer 30 is not relaxed. Accordingly, the indium gallium nitride layer 30 is formed with the composition and the film thickness in the range shown by the hatched lines. Since the indium gallium nitride layer receives a stress from the gallium nitride layer, a crystal of indium gallium nitride is formed by matching the inter-lattice distance of the indium gallium nitride layer with the inter-lattice distance of the gallium nitride layer.

Here, when the indium gallium nitride layer is stacked thickly, and the film thickness thereof exceeds the critical film thickness, the indium gallium nitride layer cannot endure a stress from the gallium nitride layer to generate crystal defect in the indium gallium nitride layer, and thereby the indium gallium nitride layer is relaxed. For this reason, the crystallinity of the indium gallium nitride layer deteriorates. Accordingly, in the case of stacking the indium gallium nitride layer without being relaxed, the indium gallium nitride layer is to be formed within the thin range.

FIG. 4C is a diagram showing lattice connection in a case in which the gallium nitride layer and the indium gallium nitride layer are continuously connected laterally. When the indium gallium nitride layer is stacked without being relaxed, the crystallinity of the indium gallium nitride layer becomes high. The crystallinity becomes high to cause the 2 dimensional electron gas to be increased, and it becomes possible to make the electron mobility high, and the saturated drift speed improves.

In the high power device 100 of the present embodiment, the multiple quantum well layer 30 is a stacked layer of the indium gallium nitride layers and the gallium nitride layers. The inter-lattice distances of the indium gallium nitride layer and the gallium nitride layer are different, but the indium gallium nitride layer is thinly formed, and thereby the indium gallium nitride layer can be stacked without being relaxed. In addition, the indium gallium nitride layers and the gallium nitride layers are stacked so as to form the multiple quantum well structure, and thereby the thickness thereof can be made thick. The multiple quantum well layer 30 is formed thickly in this manner, and thereby the electron mobility is increased, the high density 2 dimensional electron gas can be obtained, and the high frequency performance can be obtained.

In addition, the aluminum gallium nitride layer 40 which is to be stacked on the indium gallium nitride layer of the multiple quantum well layer 30 is stacked so as to match the inter-lattice distance of the aluminum gallium nitride layer with that of the gallium nitride layer 20, in the same manner as the indium gallium nitride layer of the multiple quantum well layer 30, and thereby a layer without being relaxed may be formed as the aluminum gallium nitride layer 40. These layers are not relaxed, and thereby a high power device with a good crystallinity can be formed, and it becomes possible to suppress a trap level and so on from being formed.

Hereinafter, a manufacturing method of the high power device 100 of the present embodiment will be described below. At the time of manufacturing the high power device 100, a crystal of GaN is grown on the substrate 10 by an MOCVD (Metal Organic Chemical Vapor Deposition) method or the like to stack the gallium nitride layer 20. The MOCVD method is a method in which an organic metal and a carrier gas are supplied on the substrate 10 and are chemically reacted on the heated substrate in the gas phase to epitaxially grow a semiconductor layer.

After the gallium nitride layer 20 has been stacked on the substrate 10, trimethyl indium (TMI), trimethyl gallium (TMG), triethyl gallium (TEG), triethyl indium (TEI) of the organic metal raw material and an ammonia gas are supplied along with a carrier gas (nitrogen or hydrogen), and are reacted, and thereby the indium gallium nitride layer is stacked on the gallium nitride layer 20.

Then, the gallium nitride layer is formed on the indium gallium nitride layer in the same manner as the gallium nitride layer is formed on the substrate 10. The indium gallium nitride layers and the gallium nitride layers are alternately stacked to stack the multiple quantum well layer 30.

After the multiple quantum well layer 30 has been stacked on the gallium nitride layer 20, trimethyl gallium, triethyl gallium, trimethyl aluminum (TMA), an ammonia gas and the carrier gas are supplied and are reacted to stack the aluminum gallium nitride layer 40 on the multiple quantum well layer 30.

However, the MOCVD method is an example of a stacking method of these nitride semiconductor layers, and in the present embodiment, the stacking method of these nitride semiconductor layers is not limited to the MOCVD method.

After the aluminum gallium nitride layer 40 has been stacked, the source electrode 50, the gate electrode 51 and the drain electrode 52 are formed on the aluminum gallium nitride layer 40.

As described above, the high power device 100 of the present embodiment has the gallium nitride layer 20, the multiple quantum well layer 30 and the aluminum gallium nitride layer 40, and the multiple quantum well layer 30 is formed by stacking the indium gallium nitride layers without being relaxed and the gallium nitride layers. For the reason, the high power device 100 has the 2 dimensional electron gases of a high mobility and a high density by the number of the quantum well layers, and thereby a high performance can be expected.

Modification 1 of Embodiment

Figure 5:
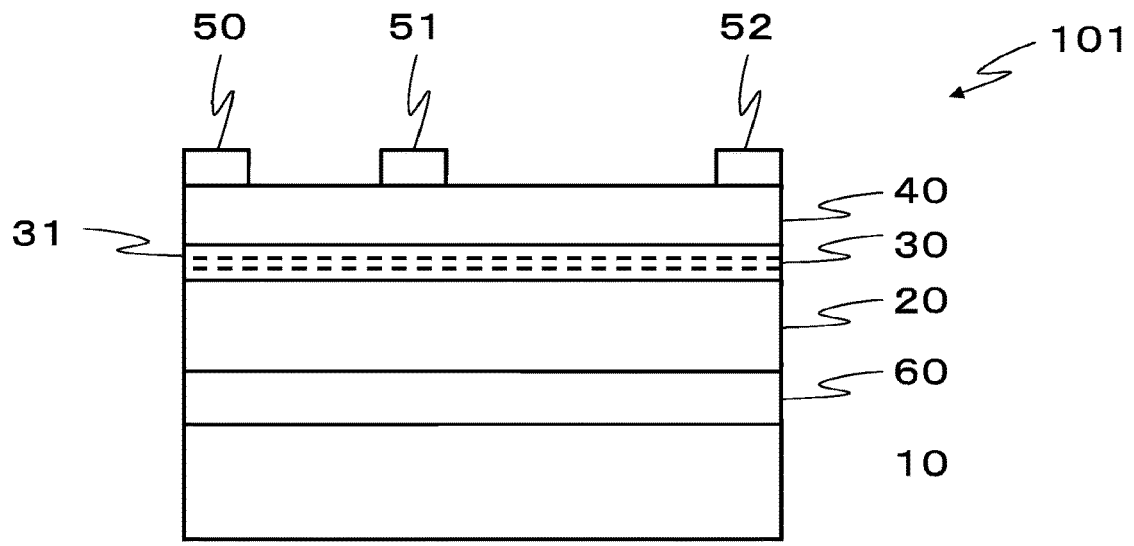
FIG. 5 is a sectional view of a modification of the embodiment.

FIG. 5 shows a modification of the embodiment. A high power device 101 of the modification has a buffer layer 60 between the substrate 10 and the gallium nitride layer 20. When the gallium nitride layer 20 is directly formed on the substrate 10, a defect is generated in the crystal structure of the gallium nitride layer 20, due to the difference between crystal structures of the substrate 10 and the gallium nitride layer 20, and the defect may affect the stack of the multiple quantum well layer 30. For the reason, in the modification, the buffer layer 60 is inserted to improve the crystallinity of the gallium nitride layer 20. The buffer layer 60 is an indium aluminum gallium nitride layer (In$_a$Al$_b$Ga$_{(1-a-b)}$N, 1≥a≥0, 1≥b≥0).

Modification 2 of Embodiment

Figure 6:
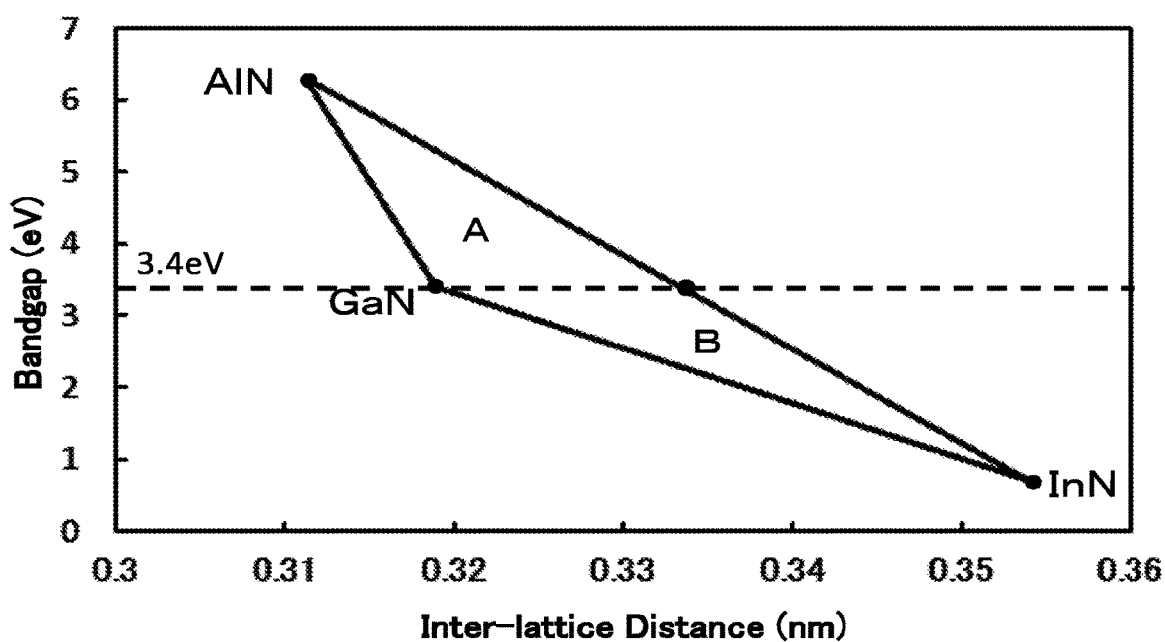
FIG. 6 is a correlation diagram showing a correlation of an inter-lattice distance and a bandgap of the modification of the embodiment.

FIG. 6 is a correlation diagram showing a correlation of an inter-lattice distance and a bandgap of the present modification. A broken line in FIG. 6 is a line of a value (about 3.4 eV) of the bandgap of gallium nitride. In the drawing, a value of the inter-lattice distance and a value of the bandgap of each of AlN, GaN, InN is plotted, and in a triangle obtained by connecting the respective plot points, a region above the broken line is made to be an A region, and a region below the broken line is made to be a B region. That is, a region having a value of a bandgap larger than that of gallium nitride is made to the A region, and a region having a value of a bandgap lower than that of gallium nitride is made to be the B region.

In the modification 2, the second nitride semiconductor layer may use a material existing in the B region having a value of a bandgap lower than that of gallium nitride, in place of the indium gallium nitride layer composing the multiple quantum well layer 30. That is, the indium gallium nitride layer composing the second nitride semiconductor layer may be replaced by an indium nitride layer (InN), or any of an indium aluminum gallium nitride layer (InAlGaN) or an indium aluminum nitride layer (InAlN) having a value of a bandgap lower than the value of the bandgap of gallium nitride (GaN). It is desirable that a film thickness of the indium nitride layer (InN), or the indium aluminum gallium nitride layer (InAlGaN), or the indium aluminum nitride layer (InAlN) is up to 10 nm.

In addition, in the modification 2, the third nitride semiconductor layer may use a material existing in the A region having a value of a bandgap larger than that of gallium nitride, in place of the aluminum gallium nitride layer 40. That is, the third nitride semiconductor layer may be an aluminum nitride layer (AlN), or any of the indium aluminum gallium layer (InAlGaN) or the indium aluminum nitride layer (InAlN) layer having a value of a bandgap higher than the value of the bandgap of gallium nitride (GaN).

In the modification 2, the buffer layer 60 may be provided similarly as the modification 1.

According to the embodiment of the present invention and the modifications, it is possible to provide a high power device which has a channel layer with a good crystallinity and a 2 dimensional electron gas of a high mobility and a high density.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A high power device comprising:
a first nitride semiconductor layer;
a second nitride semiconductor layer formed on the first nitride semiconductor layer, wherein the second nitride semiconductor layer is a multiple quantum well layer in which an InN layer and a GaN layer are alternately stacked;
a third nitride semiconductor layer containing an Al element formed on the second nitride semiconductor layer; and
a source electrode, a gate electrode and a drain electrode formed on the third nitride semiconductor layer, wherein the source electrode, the gate electrode and the drain electrode are formed separately to each other, and the source electrode and the drain electrode are formed so as to sandwich the gate electrode.

2. The high power device according to claim 1, wherein:
a film thickness of the InN layer is not more than 10 nm, and
a film thickness of the GaN layer is not more than 20 nm.

3. The high power device according to claim 2, wherein:
a number of pairs of the InN layer and the GaN layer in the multiple quantum layer is not more than 100.

4. The high power device according to claim 1, wherein:
the third nitride semiconductor layer is an $Al_yGa_{1-y}N$ layer ($1 \geq y > 0$).

5. The high power device according to claim 1, further comprising a substrate and a buffer layer provided on the substrate;
wherein the first nitride semiconductor layer is formed on the buffer layer, and
wherein the buffer layer is an $In_aAl_bGa_{(1-a-b)}N$ layer ($1 \geq a \geq 0$, $1 \geq b \geq 0$).

6. The high power device according to claim 4, further comprising a substrate and a buffer layer provided on the substrate;
wherein the first nitride semiconductor layer is formed on the buffer layer, and
wherein the buffer layer is an $In_aAl_bGa_{(1-a-b)}N$ layer ($1 \geq a \geq 0$, $1 \geq b \geq 0$).

7. The high power device according to claim 5, wherein:
the substrate is any one of Si, SiC, $\alpha$—$Al_2O_3$, ZnO, GaN, AlN and diamond.

8. The high power device according to claim 6, wherein:
the substrate is any one of Si, SiC, $\alpha$—$Al_2O_3$, ZnO, GaN, AlN and diamond.

9. The high power device according to claim 1, wherein:
a film thickness of the InN layer is 0.26 nm, and
a film thickness of the GaN layer is not more than 20 nm.

* * * * *